United States Patent [19]

Marshall

[11] 4,045,750

[45] Aug. 30, 1977

[54] ELECTRICAL CABLE AND COUPLING ARRANGEMENT

[75] Inventor: Richard C. Marshall, Hertfordshire, England

[73] Assignee: Xerox Corporation, Stamford, Conn.

[21] Appl. No.: 688,502

[22] Filed: May 20, 1976

[30] Foreign Application Priority Data

Oct. 16, 1975 United Kingdom ............... 42422/75

[51] Int. Cl.[2] .......................... H03H 7/48; H03H 1/00

[52] U.S. Cl. ..................................... 333/6; 174/35 R; 174/117 FF; 174/117 A; 333/84 R; 333/8

[58] Field of Search ............. 174/32, 33, 35 R, 126 C, 174/117 A, 117 F, 117 FF, 117 PC; 333/1, 4–6, 8, 26, 84 R, 84 M

[56] References Cited

U.S. PATENT DOCUMENTS

| | | | |
|---|---|---|---|
| 3,459,879 | 8/1969 | Gerpheide | 333/1 X |
| 3,524,921 | 8/1970 | Wolf | 174/117 FF X |
| 3,543,198 | 11/1970 | Stopper | 333/84 M |
| 3,609,600 | 9/1971 | Kassabgi | 333/84 R X |
| 3,704,164 | 11/1972 | Travis | 174/117 FF X |
| 3,764,727 | 10/1973 | Balde | 333/84 M X |
| 3,818,117 | 6/1974 | Regner et al. | 174/117 FF X |
| 3,846,721 | 11/1974 | Fritz et al. | 333/84 M X |

*Primary Examiner*—Paul L. Gensler
*Attorney, Agent, or Firm*—Earl T. Reichert

[57] ABSTRACT

An electrical main cable has a continuous flat strip of flexible insulating material, which strip carries a plurality (e.g., three strips) of longitudinally-extending strips of conductive material in an electrically balanced configuration. To connect a branch cable to the main cable, an inductive-coupling cable termination is used, the cable termination having a flat insulating member carrying a conductive strip in the form of an inductive coupling loop including substantially linear portions for alignment with the three strips of conductive material in the main cable, the cable termination having an adhesive coated surface portion.

4 Claims, 8 Drawing Figures

ELECTRICAL CABLE AND COUPLING ARRANGEMENT

BACKGROUND OF THE INVENTION

This invention relates to electrical cables, and to coupling arrangements for use therewith.

In the transmission of information by electrical cable, especially in such fields as industrial telemetry and cable-television, it is usual to connect a number of terminals to a common or shared main cable by providing an appropriate number of fixed connectors spaced apart along the main cable. It is expected that in the future such systems will be used extensively for the transmission of information between offices. In order to enable branch line connections to be made to a common or shared main cable which is typically a coaxial cable, after installation of the cable, various couplings have been proposed, usually involving cutting an outer cover of the cable and using either direct connection or inductive coupling to the inner conductor. This gives rise to the problem that a relatively complex procedure is needed to make a connection between a branch line cable and a main cable, and that if a branch line is no longer needed and is disconnected, there is a break in the outer conductor and usually also in the intermediate insulator of the cable. This in turn can give rise to interference during coupling, and disconnection, and to poor reliability.

SUMMARY OF THE INVENTION

It is an object of the present invention to provide an electrical cable and a branch line coupling arrangement for such a cable, which reduces the disadvantages of the known cables and connectors. According to the present invention there is provided an electrical cable comprising a continuous flat strip of a flexible insulating material carrying a plurality of generally longitudinally-extending strips of conductive material in an electrically balanced configuration which in use for the electrical transmission of information produces substantially no electromagnetic far field, the cable having an adhesive coated surface portion.

In one embodiment of the invention, there are three generally parallel strips of conductive material.

The invention also provides an inductive-coupling cable termination for coupling a branch cable to a cable as defined in the previous paragraph, comprising a flat insulating member carrying a conductive strip in the form of an inductive coupling loop including substantially linear portions for alignment with the three strips of conductive material, the cable termination having an adhesive coated surface portion.

An electrical cable and a branch line coupling arrangement therefor in accordance with the invention will now be described.

DETAILED DESCRIPTION OF THE INVENTION

Figure 1:
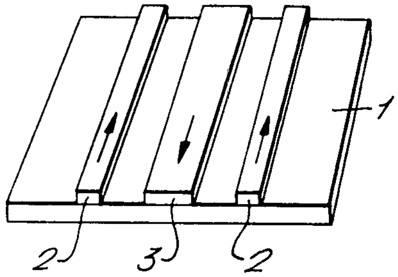
FIG. 1 is a perspective view of a portion of a first embodiment of a cable in accordance with the invention.

Referring to FIG. 1, a first embodiment of the cable comprises a continuous flat strip 1 of a flexible insulating material which carries three generally parallel strips of conductive material which extend side by side longitudinally of the insulating strip 1. The three strip arrangement is intended to carry currents of phases represented by the arrows, the outermost conductive strips 2 being connected together in use to carry current of one phase, with the central conductive strip carrying current of the opposite phase. The insulating strip 1 is typically of a plastics material of the order of 0.25 mm thick, and the conductive strips 2 and 3 are typically of a flexible conductive metal, such as copper, some 0.1 mm thick. Preferably, the outer conductive strips 2 are about 1.5 mm wide, with the central strip 3 about 3mm wide, so that the resistance per unit length of each of the outermost conductive strips is twice the resistance per unit length of the central strip. The conductive strips may either be secured on the surface of the insulating strip 1, or may be embedded in it either partially or completely. Either the upper or the lower surface of the cable carriers an adhesive coating, perferably of the self adhesive pressure sensitive variety, in which case the cable is advantageously supplied with a backing strip (not shown) protecting the adhesive layer, so that when it is desired to use the cable, the protective strip is removed and the cable fixed to a suitable support surface such as a wall.

Figure 2:
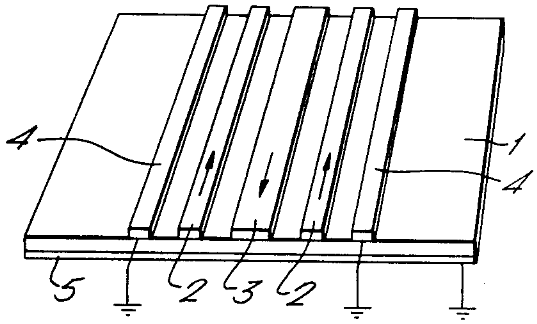
FIG. 2 is a perspective view of a portion of a second embodiment of the cable.
Figure 3:
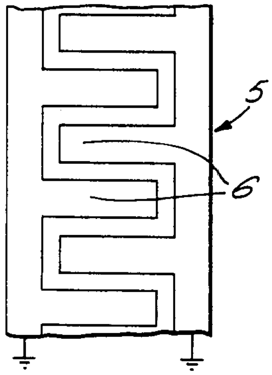
FIG. 3 is a diagrammatic representation of a suitable ground plane configuration for the FIG. 2 embodiment.

In an alternative embodiment, shown in FIG. 2, two additional conductive strips 4 are provided outside the conductive strips 2. These outermost conductive strips 4 are grounded in use to provide electrostatic shielding for the current carrying inner conductors. In addition, a ground plane may be provided on the opposite face of the insulating strip 1 from the conductive strips, the ground plane 5 preferably comprising two conductive strips with interleaved, transversely-extending portions 6, as shown in FIG. 3. This will also reduce the effect on cable charcteristic of various substrates to which the cable might be attached.

In both the FIG. 1 and FIG. 2 embodiments, a layer of insulating material (not shown) may cover the conductive strips. If such an additional insulation layer is present, this layer may carry the adhesive coating.

Figure 4:
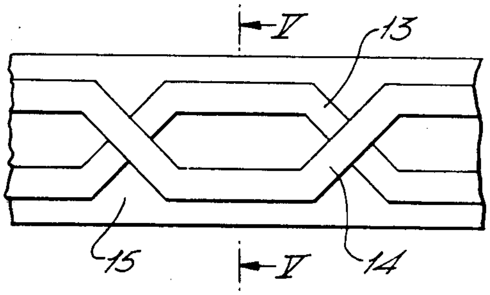
FIG. 4 is a plan view of a portion of a third embodiment of the cable.
Figure 5:
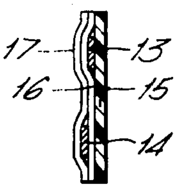
FIG. 5 is a cross-section on the line V—V of FIG. 4.

FIGS. 4 and 5 show a further alternative embodiment employing two conductive strips 13 and 14 which are transposed at regular intervals (as shown) as in telephone practice. Conductive strip 13 is carried on an insulating layer 16. Conductive strip 14 is carried on the insulating layer 16, and may be protected by an optional insulating layer 17. As in the previously described embodiments, one of the external surfaces of the cable carries an adhesive coating. Furthermore, the arrangement shown in FIG. 4 and 5 may be modified by the addition of two further conductive strips (not shown), one on each side of the conductive strips 13 and 14. A ground plane may also be added, as described with reference to FIG. 3.

A spaced pair of parallel conductive lines will give rise to an electromagnetic radiation field when used to transmit information electrically, due to the current variations needed to transmit the information. Although the electromagnetic far field is small for lines with a small spacing, it can be troublesome, and such lines also tend to pick up high frequency external signals.

The configuration of basic cables in accordance with the invention which are described above, comprising either three parallel conductive strips or two conductive strips with transpositions, are examples of electrically balanced cables in which the electromagnetic far field is substantially zero, provided that the spacing between the conductors, and in the two strip case the distance between transpositions, are small compared with the wavelength of the high frequency current being used to carry the information. The pick up of external signals is also minimized.

Figure 6:
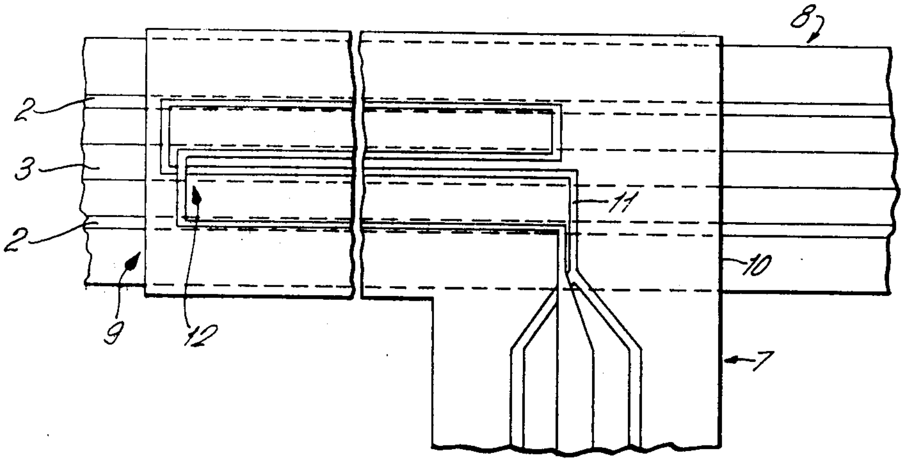
FIG. 6 is a plan view illustrating a branch line coupling arrangement.

Referring now to FIG. 6, there is shown an arrangement for connecting a branch line cable 7 to a main line cable 8. The cable 8 shown in FIG. 6 is of the kind shown in FIG. 1 but it will be appreciated that a cable of the kind shown in FIG. 2 may be used instead. The branch cable 7 may similarly be a cable of the kind shown in either FIG. 1 or FIG. 2, or may be a conventional coaxial cable. The characteristic impedance of the branch cable may differ from that of the main cable, and a terminating resistor may be included in series or in shunt with the branch cable as appropriate. The terminating portion 9 of the branch cable 7 comprises a flat, flexible, insulating base 10 which carries a pick-up loop in the form of a conductive strip 11, for example of a conductive metal foil, arranged in figure-of-eight configuration as shown. Appropriate substantially linear portions of the conductor 11 extend adjacent to the conductors 2 and 3 in order to establish an inductive coupling, whereby currents flowing in the conductors 2 and 3 of main line cable 8 induce a correspondingly phased current flowing around the loops of the conductor 11. The two strands of the conductor 11 which overlap one another at point 12 are insulated from one another by an intervening insulating layer. A branch line cable termination of this kind, which may also be provided with a self adhesive layer, can be readily fixed to a main line cable of the kind described, and may equally easily be removed without causing interference on the line either during fixing, or while fixed in place, or after removal from the line.

A number of variations on the figure-of-eight configuration just described may be used. For example, the single flat strip conductor may be replaced by a multi-turn coil, each turn of which follows the figure-of-eight shape. Instead of using a single flat strip or a single length of a conductor in a multi-turn coil, two separate strips or coils may be used, the strips of coils in these circumstances being formed into separate loops which are joined to form essentially the same circuit as that just described. In a further variation, a single, continuous conductor, for example a flat strip, may be formed in the configuration of a vertical column of two or more joined figures-of-eight, the top of one figure-of-eight touching the bottom of the next one, each figure-of-eight being of the kind shown in FIG. 6 and being joined to its neighbor by an insulated crossover of the kind found at the center of the single figure-of-eight shown in FIG. 6. The individual figures-of-eight are then superimposed over each other in a set of parallel planes by, for example, making concertina-type folds in an insulating base strip which carries the conductor. The conductors of successive layers are, of course, insulated from each other.

Figure 7:
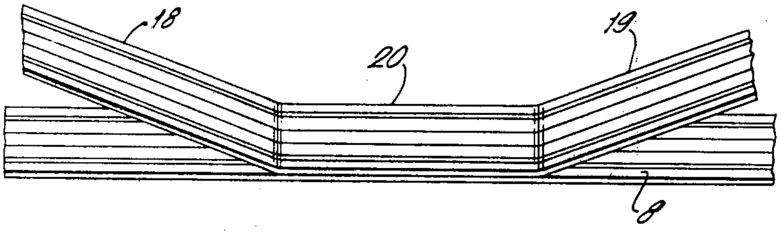
FIG. 7 is a perspective view of an alternative embodiment of a branch line coupling arrangement for coupling two branch line cables to the same section of a main line cable.

Referring now to FIG. 7, there is shown an alternative form of branch line coupling for use with a three-conductor cable 8 when it is desired to couple two branch line cables to the same section of a main line cable. The two branch line cables are constituted by adjacent portions 18 and 19 of a further length of a three-conductor cable of the same configuration as the main line cable, the portion 20 of the further length of cable between the portions 18 and 19 being laid over, and adhering to, the main line cable 8.

Figure 8:
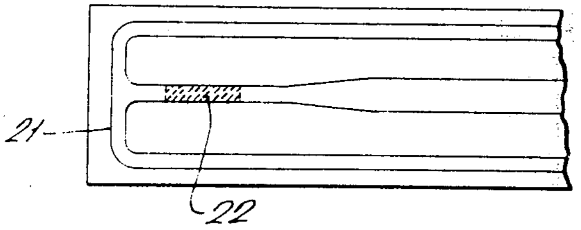
FIG. 8 is a plan view of a further embodiment of a branch line coupling arrangement.

If it is desired to connect only a single branch line to a main line cable, the coupling arrangement of FIG. 8 may be used as an alternative to the arrangement of FIG. 6. As in the FIG. 7 embodiment, the branch line is a three-conductor cable, but in this case is terminated as shown by a transverse conductive strip 21 interconnecting all three of the longitudinally extending strips. In this arrangement, it is necessary to electrically terminate the branch line cable end, for example by means of a resistive portion 22 of the central conductor. The two inductive couplings which are formed are effectively in parallel with one another. By way of contrast, in the FIG. 6 arrangement the two inductive couplings are effectively in series.

It can thus be seen that the cable and coupling in accordance with the invention provide a very convenient form of cable which can be run, for example, around an office area, at the same time enabling any number of branch lines to be easily fixed to or removed from the main line without the need to physically disturb the main line cable in any way.

While the invention has been described with reference to the structure disclosed, it is not confined to the details set forth, but is intended to cover such modifications or changes as may come within the scope of the following claims.

What is claimed is:

1. An electrical cable having an adhesive coated surface portion, the cable comprising a continuous flat strip of flexible insulating material carrying:

a. a central first conductive strip and second and third conductive strips on each side of and generally parallel to the first conductive strip in an electrically balanced configuration, the first conductive strip being for carrying current of one phase, the second and third conductive strips being for jointly carrying current of the opposite phase and each having a resistance per unit length which is twice the resistance per unit length of the first conductive strip, and outermost fourth and fifth conductive strips on the outermost sides of and generally parallel to the second and third conductive strips, the fourth and fifth conductive strips being for connection to ground; and b. a conductive member spaced by the insulating material from the conductive strips, the conductive member constituting a ground plane for the cable.

2. An electrical cable having an adhesive coated surface portion, the cable comprising a continous flat strip of flexible insulating material carrying a central first conductive strip and second and third conductive strips on each side of and generally parallel to the first conductive strip in an electrically balanced configuration, the first conductive strip being for carrying current of one phase, the second and third conductive strips being for jointly carrying current of the opposite phase and each having a resistance per unit length which is twice the resistance per unit length of the first conductive strip, in combination with an inductive-coupling cable termination for coupling a branch line cable to the electrical cable, the cable termination comprising a flat insulating member carrying a conductor in the form of at least one inductive coupling loop, the loop including substantially linear portions for alignment with the first, second, and third conductive strips, the cable termination having an adhesive coated surface portion.

3. The combination set forth in claim 2, wherein the inductive coupling loop is in a figure-of-eight configuration, with the two strands of a loop at the cross-over point of the figure-of-eight being insulated from one another.

4. An electrical cable having an adhesive coated surface portion, the cable comprising a continuous flat strip of flexible insulating material carrying a central first conductive strip and second and third conductive strips on each side of and generally parallel to the first conductive strip in an electrically balanced configuration, the first conductive strip being for carrying current of one phase, the second and third conductive strips being for jointly carrying current of the opposite phase and each having a resistance per unit length which is twice the resistance per unit length of the first conductive strip, in combination with an inductive-coupling cable termination for coupling a branch line cable to the electrical cable, the cable termination comprising a flat insulating member carrying a central fourth conductive strip and fifth and sixth conductive strips on each side of and generally parallel to the fourth conductive strip for alignment with the first, second, and third conductive strips of the electrical cable, the fourth, fifth and sixth conductive strips of the cable termination being electrically interconnected at their ends by a transverse conductive strip and including an electrical cable termination comprising an electrically resistive element between the fourth conductive strip and the outer fifth and sixth conductive strips, the cable termination having an adhesive coated surface portion.

* * * * *